(12) United States Patent
Iwasaki et al.

(10) Patent No.: US 9,735,055 B2
(45) Date of Patent: Aug. 15, 2017

(54) ELECTRONIC CIRCUIT UNIT AND METHOD OF MANUFACTURING ELECTRONIC CIRCUIT UNIT

(71) Applicant: ALPS ELECTRIC CO., LTD., Tokyo (JP)

(72) Inventors: Ryo Iwasaki, Miyagi-ken (JP); Shoji Kai, Miyagi-ken (JP); Shunji Kuwana, Miyagi-ken (JP); Shiro Ikeda, Miyagi-ken (JP)

(73) Assignee: ALPS ELCTRIC CO., LTD., Tokyo (JP)

( * ) Notice: Subject to any disclaimer, the term of this patent is extended or adjusted under 35 U.S.C. 154(b) by 33 days.

(21) Appl. No.: 14/333,137

(22) Filed: Jul. 16, 2014

(65) Prior Publication Data

US 2015/0054157 A1 Feb. 26, 2015

(30) Foreign Application Priority Data

Aug. 21, 2013 (JP) .................................. 2013-171214

(51) Int. Cl.
| | |
|---|---|
| *H01L 23/00* | (2006.01) |
| *H01L 21/78* | (2006.01) |
| *H01L 23/10* | (2006.01) |
| *H05K 3/00* | (2006.01) |
| *H01L 23/552* | (2006.01) |

(52) U.S. Cl.
CPC .............. *H01L 21/78* (2013.01); *H01L 23/10* (2013.01); *H05K 3/0052* (2013.01); *H01L 23/552* (2013.01); *H01L 2924/0002* (2013.01); *H05K 2201/0989* (2013.01); *H05K 2203/0228* (2013.01); *H05K 2203/0594* (2013.01)

(58) Field of Classification Search
CPC ......... H01L 24/06; H01L 24/89; H01L 21/78; H01L 29/00; H01L 21/67; H01L 2224/06; H01L 2924/00014; H01L 2924/00
See application file for complete search history.

(56) References Cited

U.S. PATENT DOCUMENTS

| | | | |
|---|---|---|---|
| 2008/0174005 A1* | 7/2008 | Kubota | ................... H01L 23/13 257/700 |
| 2010/0193932 A1* | 8/2010 | Kang et al. | ................... 257/690 |
| 2012/0104571 A1* | 5/2012 | Yoo | ....................... H01L 23/552 257/659 |

FOREIGN PATENT DOCUMENTS

JP 2011-18699 1/2011

* cited by examiner

*Primary Examiner* — Fernando L Toledo
*Assistant Examiner* — Lawrence-Linh T Nguyen
(74) *Attorney, Agent, or Firm* — Beyer Law Group LLP

(57) ABSTRACT

An electronic circuit unit includes a circuit substrate having a rectangular shape and is obtained by cutting an integral substrate along a vertical cut line and a horizontal cut line to be separated; a copper foil land soldered to components; and a substrate outer edge, which is formed by cutting, of two sides orthogonal to each other. The copper foil land and the substrate outer edge are positioned in the vicinity of a corner of the circuit substrate. Solder resist is provided around the copper foil land. A plurality of substrate exposure portions without the solder resist is provided in the vicinity of the substrate outer edge.

3 Claims, 6 Drawing Sheets

ELECTRONIC CIRCUIT UNIT AND METHOD OF MANUFACTURING ELECTRONIC CIRCUIT UNIT

CLAIM OF PRIORITY

This application claims benefit of Japanese Patent Application No. 2013-171214 filed on Aug. 21, 2013, which is hereby incorporated by reference.

BACKGROUND OF THE INVENTION

1. Field of the Invention

The present invention relates to an electronic circuit unit in which electronic components or the like are built in a circuit substrate which is obtained by cutting an integral substrate to be separated, and a method of manufacturing the electronic circuit unit.

2. Description of the Related Art

After a plurality of circuit portions corresponding to a plurality of electronic circuit units is collectively provided on an integral substrate, a manufacturing method of cutting the integral substrate to be separated is a manufacturing method through which productivity can be improved significantly by a small electronic circuit unit having a circuit configuration of a high density. Due to this, when such an electronic circuit unit is manufactured, a wiring pattern, solder resist, and the like are collectively formed at each of a plurality of rectangular areas divided by vertical cut lines on the integral substrate, and electronic components or the like are collectively built in. After that, a method by which the integral substrate is cut along the cut lines with a dicing saw and thereby the electronic circuit unit is obtained in plural, is generally used. Meanwhile, in the electronic circuit unit manufactured in such a way, a portion corresponding to the rectangular area of the integral substrate is a circuit substrate.

As such an electronic circuit unit, an invention described in Japanese Unexamined Patent Application Publication No. 2011-018699 is disclosed. An electronic circuit unit 900 described in Japanese Unexamined Patent Application Publication No. 2011-018699 is illustrated in FIG. 6.

In the electronic circuit unit 900, a copper foil land 905 is provided at a corner portion of a circuit substrate 902 for the electronic circuit unit 900, and a corner space area 902b with an approximately L shape is extended between the substrate outer edge 902d which is at a right angle and divides the corner portions, and an outer peripheral edge expanding out of the copper foil land 905. Solder resist 906 is provided at only a relatively wide area in the immediate vicinity of the corner edge 902a in the corner space area 902b, and a narrow area distant from the corner edge 902a becomes a substrate exposure area 902c without the solder resist 906. The circuit substrate 902 is obtained by cutting the integral substrate 910 along a vertical cut line 911 and a horizontal cut line 912 so as to be separated, and a leg of a shield cover which covers a high frequency circuit portion on the circuit substrate 902 is inserted into an attachment hole 905a of the copper foil land 905 and is soldered.

In this way, in the electronic circuit unit 900, the solder resist 906 is provided at only a relatively wide area in the immediate vicinity of the corner edge 902a in the corner space area 902b of the circuit substrate 902. Then, if the narrow area distant from the corner edge 902a becomes the substrate exposure area 902c without the solder resist 906, when the integral substrate 910 is obtained by cutting along a vertical cut line 911 and a horizontal cut line 912 to be separated, it is difficult to peel the solder resist 906 in which a contact area with a substrate surface is sufficiently secured at the corner space area. Together with this, there is no concern that resin burr of substrate materials occurs in the vicinity of the corner edge 902a. In addition, although the resin burr occurs at the substrate exposure area 902c of both end portions of the corner space area due to a cutting process, the resin burr is not seen because the substrate exposure area 902c is distant from the corner edge 902a, and thus there is little possibility that appearance of the commercialized electronic circuit unit 900 is damaged.

However, since a length of the substrate exposure area 902c of the integral substrate 910 is relatively long, it was impossible to completely remove the resin burr in the electronic circuit unit 900. In addition, furthermore, when cutting the integral substrate 910, resist burr was found. When manufacturing the electronic circuit unit 900, flux cored reflow solder is used, but when soldering the leg of the shield cover, the flux spreads and remains solidified at the portion of the cut line. As a result, the resist remains interposed in the flux, and relatively long resist burr occurs. Thus, the resist burr is seen, and there is a problem that the appearance of the commercialized electronic circuit unit 900 is damaged.

SUMMARY OF THE INVENTION

The present invention provides an electronic circuit unit in which resin burr and resist burr that occur at the time of cutting can be reduced and an appearance of which is not damaged, and also provides a method of manufacturing the electronic circuit unit, by which the electronic circuit unit can be manufactured without increasing the number of processes.

In order to solve the problem, an electronic circuit unit of the invention includes a rectangular-shaped circuit substrate and obtained by cutting an integral substrate along a vertical cut line and a horizontal cut line to be separated; a copper foil land to be soldered to components; and a substrate outer edge, which is formed by cutting, of two sides orthogonal to each other. The copper foil land and the substrate outer edge are positioned in the vicinity of a corner of the circuit substrate. Solder resist is provided around the copper foil land. A plurality of substrate exposure portions without the solder resist is provided in the vicinity of the substrate outer edge.

The electronic circuit unit configured in this way provides the plurality of substrate exposure portions in the vicinity of the substrate outer edge, thereby a width of one substrate exposure portion becomes narrow, and thus a length of the resin burr becomes short. As a result, it is possible to reduce the resin burr occurring at the time of cutting. In addition, in the vicinity of the substrate outer edge, a width of the solder resist existing between the plurality of substrate exposure portions also becomes narrow, and thereby it is possible to reduce the burr due to the solder resist occurring at the time of cutting. Therefore, the appearance of the electronic circuit unit is not damaged.

In addition, in the electronic circuit unit of an embodiment of the present invention according to the above-described configuration, there is a characteristic that the substrate exposure portion is provided at an area over which flux for soldering spreads in a wet manner.

The electronic circuit unit configured in this way may provide the substrate exposure portion at an area over which the flux for soldering spreads in a wet manner, and thereby it is possible to efficiently reduce the resist burr. Together with this, since the substrate exposure portion is not provided at an area over which the flux does not spread in a wet manner, it is possible to prevent the resin burr from occurring at an area except in the vicinity of the copper foil land.

In addition, in order to solve the problem, a method of manufacturing the electronic circuit unit according to an embodiment of the present invention, which includes a rectangular-shaped circuit substrate which is obtained in plural from an integral substrate on which high frequency circuit portions corresponding to a plurality of electronic circuit units is respectively provided, and which includes a plurality of vertical cut lines and a plurality of horizontal cut lines, includes the steps of: providing a copper foil land at a corner portion of each circuit substrate; providing solder resist at an area without the copper foil land, and at the same time providing a plurality of substrate exposure portions without the solder resist in the vicinity of each corner portion of the two cut lines orthogonal to each other; positioning a leg of a shield cover which covers each of the high frequency circuit portions on the copper foil land and then soldering the leg using flux cored solder; and cutting the integral substrate along the vertical cut line and the horizontal cut line to be separated.

The method of manufacturing the electronic circuit unit configured in this way provides the plurality of substrate exposure portions in the vicinity of the substrate outer edge, thereby the width of one substrate exposure portion becomes narrow, and thus the length of the resin burr becomes short. As a result, it is possible to reduce the resin burr occurring at the time of cutting. In addition, in the vicinity of the substrate outer edge, the width of the solder resist existing between the plurality of substrate exposure portions also becomes narrow, and thereby it is possible to reduce the burr due to the solder resist occurring at the time of cutting. Therefore, it is possible to provide a method of manufacturing the electronic circuit unit, which can manufacture, without increasing the number of processes, the electronic circuit unit in which the resin burr and the resist burr can be reduced.

DESCRIPTION OF THE PREFERRED EMBODIMENTS

Hereinafter, an embodiment of the present invention will be described with reference to the drawings. Meanwhile, in FIGS. 2, FIG. 3, and FIG. 5, in order to clearly illustrate a processing state of surface of each area of a substrate, hatching is done in each area in which a surface treatment is performed.

To begin with, a method of manufacturing an electronic circuit unit 100, and peripheral structures of copper foil lands 2 in the four corners of a circuit substrate 1 will be described by using FIGS. 1 to 4.

Figure 1:
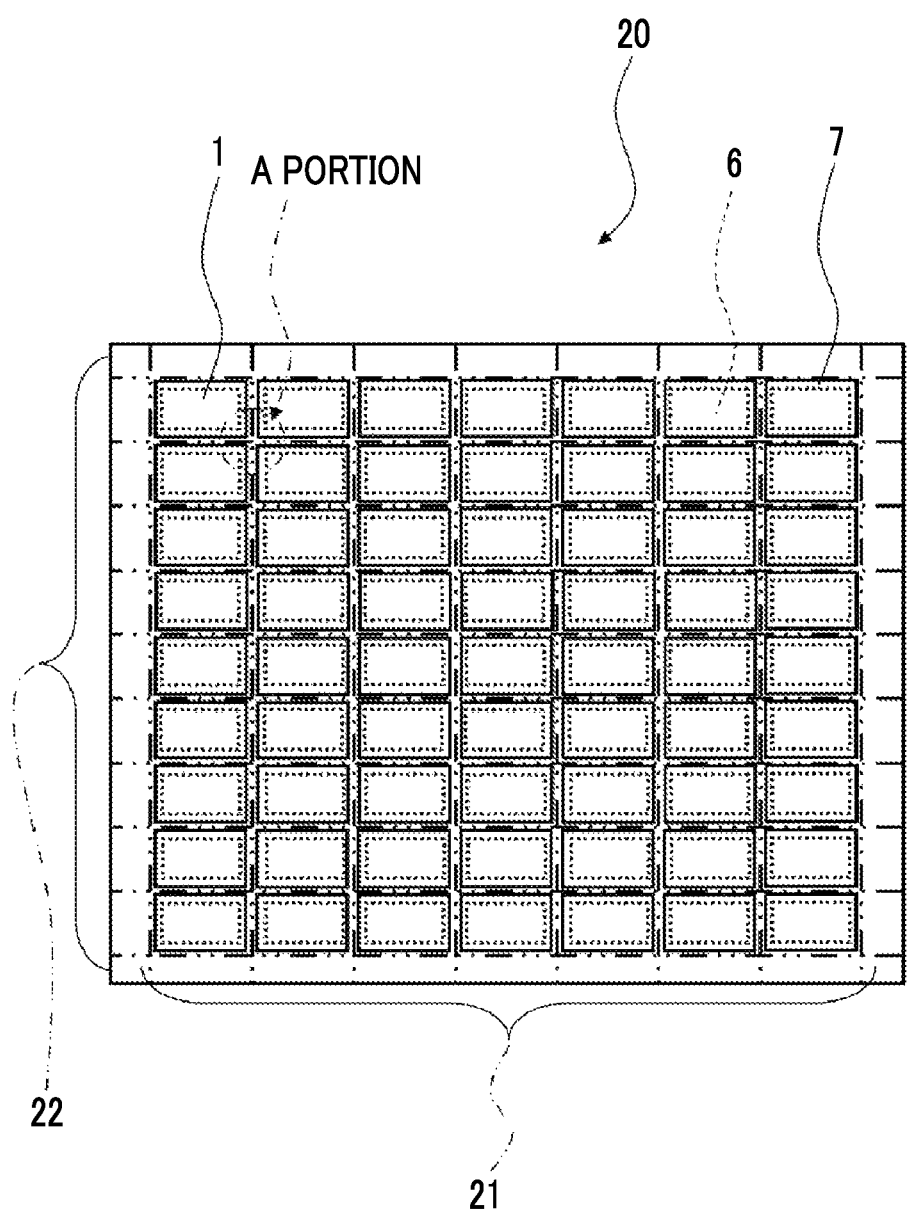
FIG. 1 is a plan view illustrating an integral substrate according to an electronic circuit unit of an embodiment of the present invention.
Figure 2:
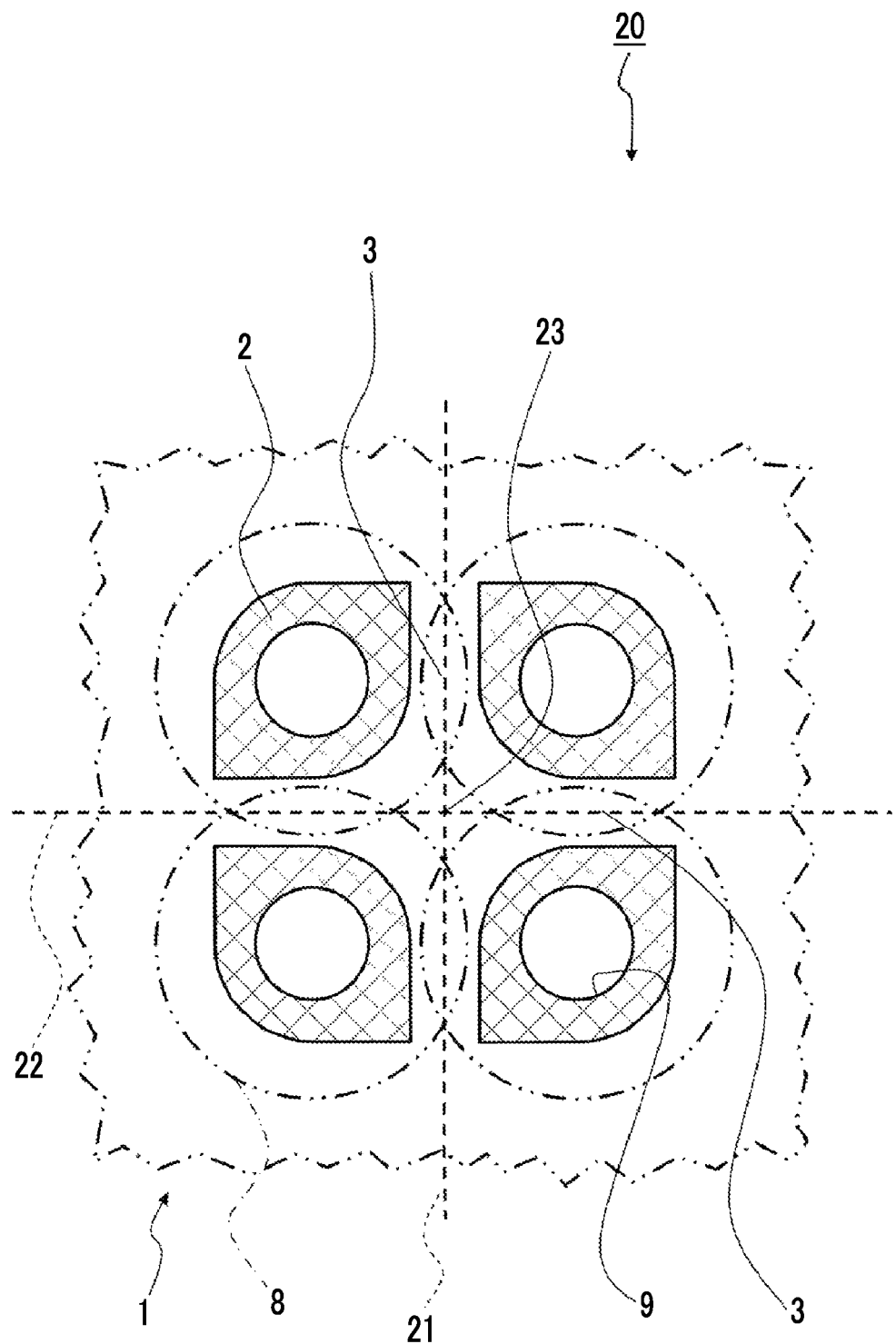
FIG. 2 is an enlarged plan view illustrating a configuration of an electronic circuit unit.
Figure 3:
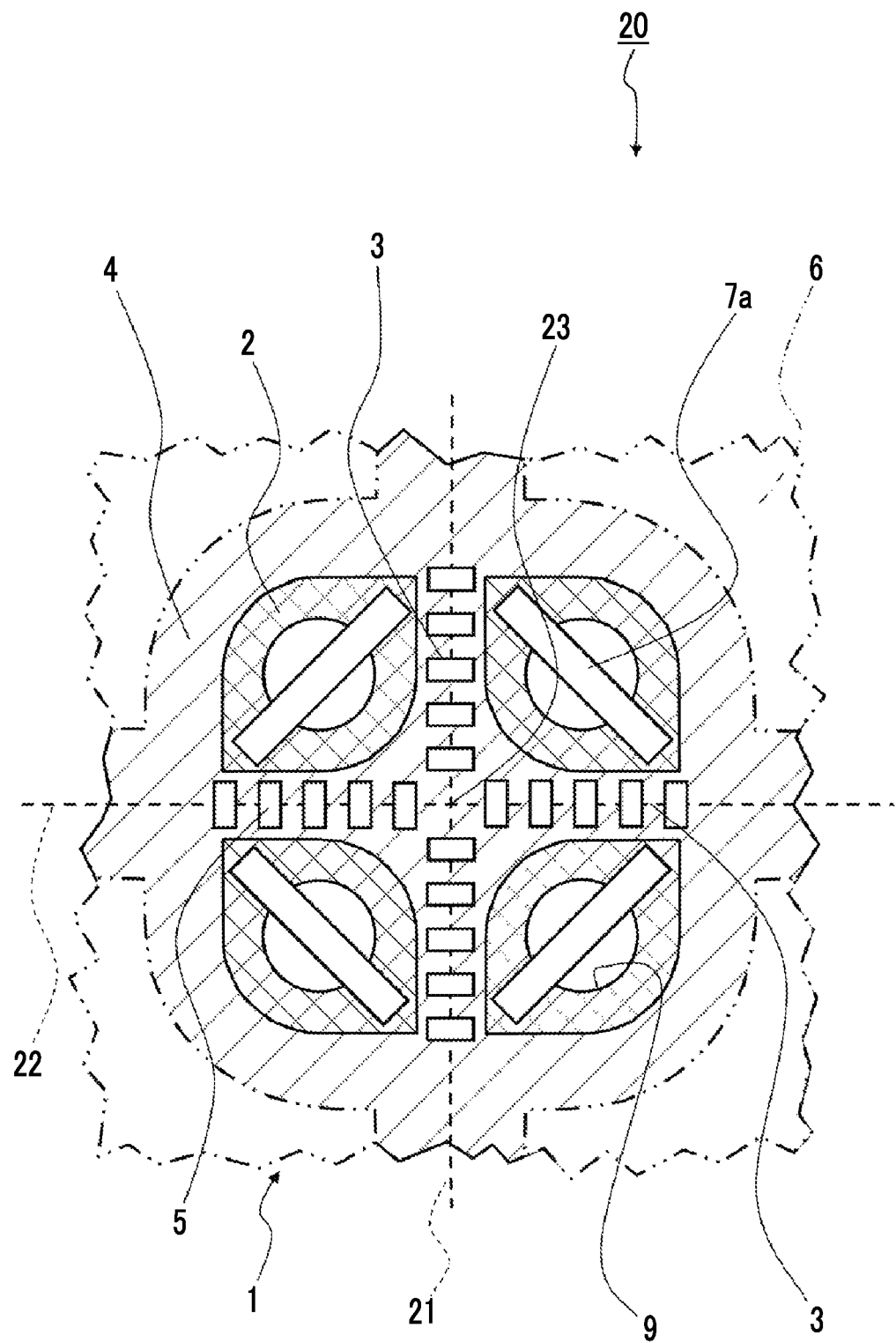
FIG. 3 is an enlarged plan view illustrating a configuration of an electronic circuit unit.
Figure 4:
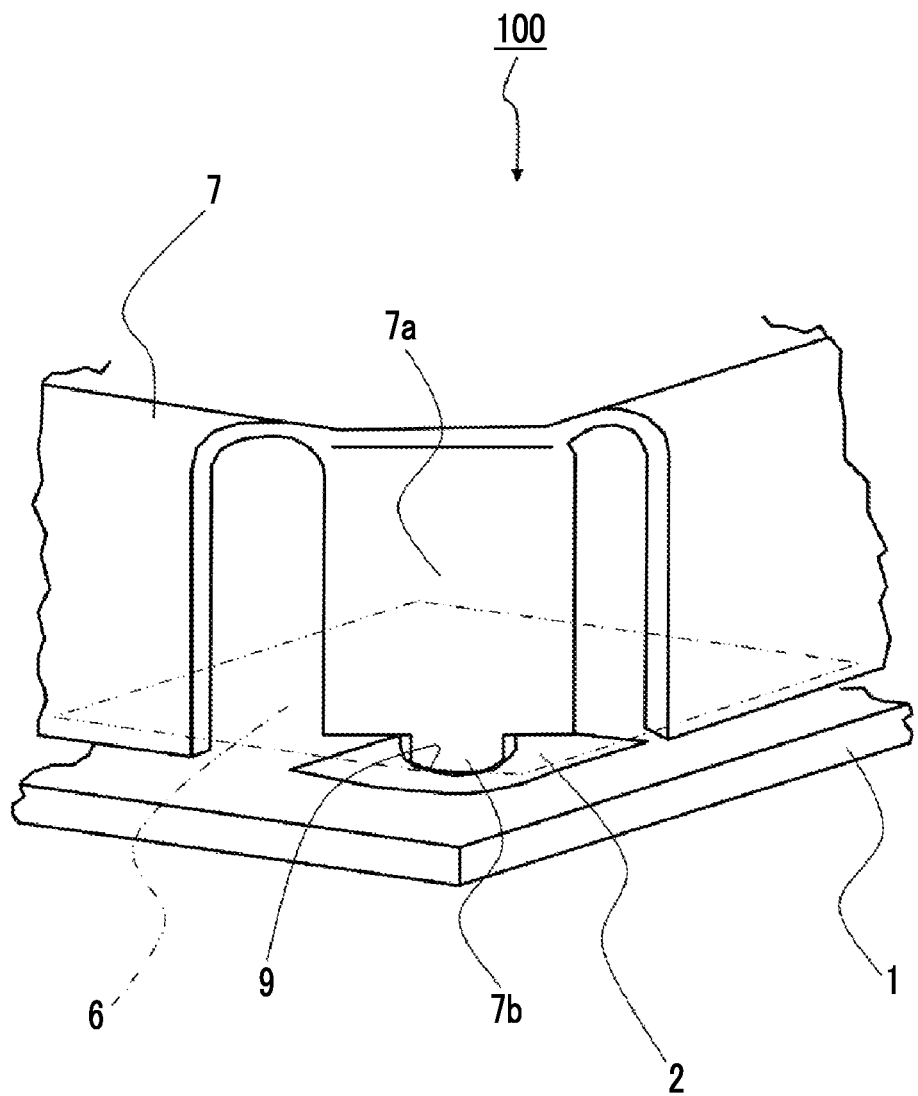
FIG. 4 is a perspective view illustrating an electronic circuit unit.

FIG. 1 is a plan view illustrating an integral substrate 20 which is a base for manufacturing the electronic circuit unit 100. Then, FIGS. 2 and 3 are enlarged plan views illustrating the peripheral structures of the copper foil lands 2 in the four corners of the circuit substrate 1, when the circuit substrate 1 is in a state of the integral substrate 20. In addition, FIG. 4 is a perspective view illustrating the electronic circuit unit 100.

As illustrated in FIG. 1, in the method of manufacturing the electronic circuit unit 100, the integral substrate 20 which includes a plurality of vertical cut lines 21 and a plurality of horizontal cut lines 22 is prepared. On the integral substrate 20, respective high frequency circuit portions 6 corresponding to a plurality of electronic circuit units 100 are provided, and shield covers 7 are attached so as to respectively cover the high frequency circuit portions 6. The high frequency circuit portion 6 is configured with a wiring pattern or various electronic components (not illustrated). The method of manufacturing the electronic circuit unit 100 is a manufacturing method by which the integral substrate 20 configured in such a way is cut along the vertical cut lines 21 and the horizontal cut lines 22, and as a result, the separated circuit substrates 1 with a rectangular shape can be obtained in plural.

Next, a structure of a corner portion of the circuit substrate 1 will be described in detail. FIG. 2 and FIG. 3 illustrate views in which an A portion illustrated in FIG. 1, that is, a portion where corner portions of four circuit substrates 1 are collected in the integral substrate 20 is enlarged. FIG. 2 illustrates a state where copper foil lands 2 are formed at the corner portions of the four circuit substrates 1, on the integral substrate 20. As illustrated in FIG. 2, the integral substrate 20 is divided into the circuit substrates 1 with a rectangular shape formed by the vertical cut lines 21 and the horizontal cut lines 22. Each circuit substrate 1 is formed by cutting along the vertical cut lines 21 and the horizontal cut lines 22 later, and has substrate outer edges 3 of two sides orthogonal to each other. In the vicinity of the corner portion of each circuit substrate 1, an attachment hole 9 for attaching a component is provided. Furthermore, the copper foil land 2 for soldering the component is formed around the attachment hole 9. The copper foil land 2 is formed collectively with other wiring patterns (not illustrated). Meanwhile, in FIG. 2, the copper foil land 2 is formed in a leaf shape, but the shape of the copper foil land 2 may be any other shape as long as it is a shape which covers the periphery of the attachment hole 9.

Next, as illustrated in FIG. 3, in the integral substrate 20, solder resists 4 are provided at areas except for the copper foil lands 2, that is, at least in the vicinity of the copper foil lands 2. The solder resists 4 are also provided at areas surrounded by the four copper foil lands 2 with a central substrate corner edge 23 as a center in the integral substrate 20. However, around an area with each of the vertical cut lines 21 and the horizontal cut lines 22 as a center which are boundaries of the plurality of circuit substrates 1, the solder resists 4 are provided, and at the same time, a plurality of substrate exposure portions 5 in which the solder resists 4 do not exist is provided. The substrate exposure portion 5 is a rectangular shape with a relatively finely set width, and a plurality of the substrates is provided at equal intervals from the vicinity of the substrate corner edge 23 to the vicinity of an end portion of the copper foil land 2. The solder resist 4 is continuous around the copper foil land 2, but later, the integral substrate 20 is cut along the vertical cut lines 21 and the horizontal cut lines 22. Accordingly, around a substrate outer edge 3 of two sides orthogonal to each other at the corner portions of each circuit substrate 1, the solder resist 4 is finely formed so as to interpose between the substrate exposure portions 5.

According to the method of manufacturing the electronic circuit unit 100, the high frequency circuit portion 6 is provided approximately at a central portion of the rectangular circuit substrate 1, and after that, as illustrated in FIG. 3 and FIG. 4, legs 7a provided at the four corners of the shield cover 7 are placed on the copper foil lands 2, and attached by soldering using a flux cored solder (not illustrated). In addition, as described above, the attachment hole 9 of a round shape is formed approximately in a center of each copper foil land 2, and a position determination is performed by inserting a protrusion portion 7b which is provided at a front end of the leg 7a into a corresponding attachment hole 9. In the electronic circuit unit 100, the high frequency circuit portion 6 arranged on the circuit substrate 1 is covered by the shield cover 7, and thereby is electromagnetically shielded. Meanwhile, in FIG. 3, only the leg 7a of the shield cover 7 is illustrated, and a main body of the shield cover 7 is not illustrated.

According to the method of manufacturing the electronic circuit unit 100, in a state where all components including the shield cover 7 are mounted on the integral substrate 20, each of the electronic circuit unit 100 is obtained by cutting the integral substrate 20 along the vertical cut lines 21 and the horizontal cut lines 22 to be separated.

In the electronic circuit unit 100, by providing a plurality of the substrate exposure portion 5 around the substrate outer edge 3, a width of each one of the exposure portions becomes narrow, and thus a length of resin burr occurring at the time of cutting becomes short. As a result, the resin burr is almost invisible. In addition, since a width of the solder resist 4 existing between the plurality of substrate exposure portions 5 around the substrate outer edge 3 is also narrowed, the burr occurring at the time of cutting due to the solder resist 4 is also invisible. Thus, it is possible to reduce the resin burr together with resist burr.

In addition, according to the method of manufacturing the electronic circuit unit 100 of an embodiment of the present invention, when manufacturing the integral substrate 20, the present invention can be performed simply by changing a pattern of the solder resist 4, and manufacturing can be performed without increasing the number of processes.

In FIG. 2, when soldering, areas over which flux 8 for soldering spreads in a wet manner are illustrated. There is a characteristic that the flux 8 for soldering spreads in a wet manner in a round shape with an attachment hole 9 as a center. As can be seen from FIG. 2, it can be seen that around the vertical cut lines 21 and the horizontal cut lines 22, the flux 8 spreads over areas in a wet manner surrounded by the four copper foil lands 2. As can be seen by comparing FIG. 2 with FIG. 3, the substrate exposure portion 5 is provided on the substrate outer edge 3 side of the area over which the flux 8 for soldering spreads in a wet manner. In this way, by providing the substrate exposure portion 5 at the area over which the flux 8 for soldering spreads in a wet manner, the resist burr can be reduced efficiently. Together with this, the substrate exposure portion 5 is not provided at the area over which the flux 8 does not spread in a wet manner, and thereby it is possible to prevent unnecessary occurrence of the resin burr.

Figure 5:
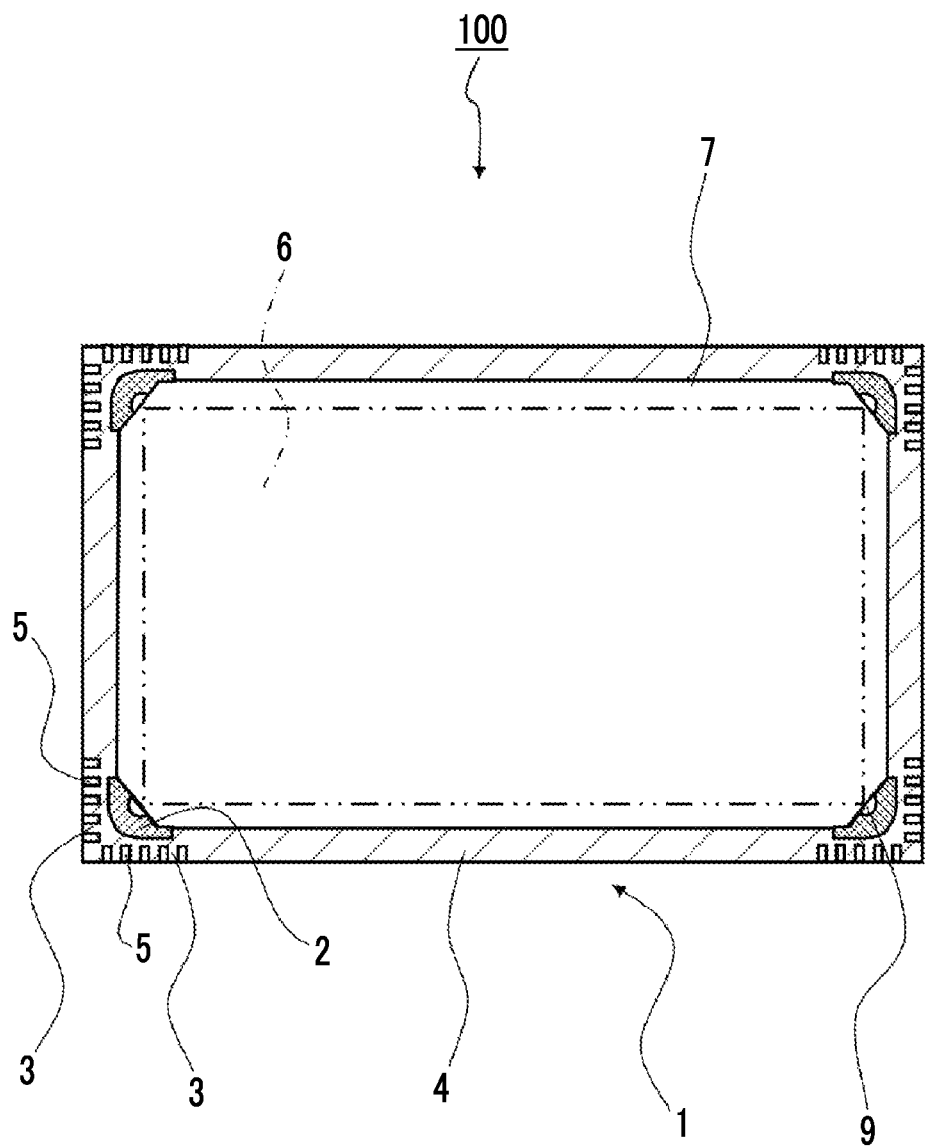
FIG. 5 is a plan view illustrating an electronic circuit unit.
Figure 6:
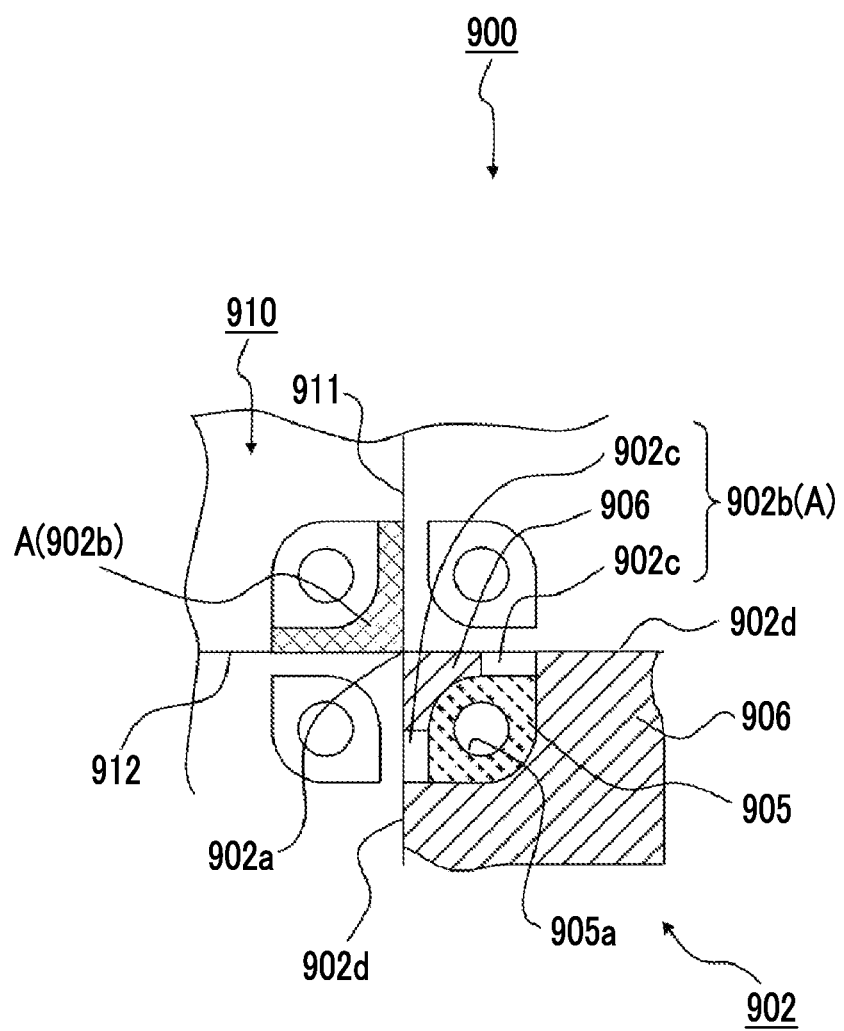
FIG. 6 is a schematic view illustrating a configuration of an electronic circuit unit according to an example of the related art.

Next, a final structure of the electronic circuit unit 100 will be described using FIG. 5. FIG. 5 is a plan view illustrating the electronic circuit unit 100 which is obtained by cutting the integral substrate 20 to be separated illustrated in FIG. 1.

As illustrated in FIG. 5, the electronic circuit unit 100 is configured with the circuit substrate 1, the high frequency circuit portion 6, and the shield cover 7 covering the high frequency circuit portion 6. The copper foil lands 2 are provided at the four corner areas of the circuit substrate 1, and the shield cover 7 is soldered on the copper foil lands 2. Around each copper foil land 2, the solder resists 4 are provided without the substrate exposure portion 5.

As illustrated in FIG. 5, the solder resist 4 is continuously provided outside of the copper foil land 2, but in the vicinity of the substrate outer edge 3 of two sides orthogonal to each other at the corner portions of each circuit substrate 1, the substrate exposure portion 5 and the solder resist 4 are alternately formed. Thus, the resin burr and the resist burr which occur during cutting are reduced.

As described above, the electronic circuit unit of an embodiment of the present invention provides a plurality of substrate exposure portions in the vicinity of the substrate outer edge, and thereby the width of the one substrate exposure portion becomes narrow. Thus, the length of the resin burr also becomes short. As a result, it is possible to reduce the resin burr occurring at the time of cutting. In addition, since in the vicinity of the substrate outer edge, the width of the solder resist existing between the plurality of substrate exposure portions also becomes narrow, it is possible to reduce the burr occurring at the time of cutting due to the solder resist. Therefore, appearance of the electronic circuit unit is not damaged. In addition, it is possible to provide the electronic circuit unit which can reduce the resin burr and the resist burr, and a method of manufacturing the electronic circuit unit which can be manufactured without increasing the number of processes.

The present invention is not limited to the description of the first embodiment above, and can be performed by appropriate modification in form in which the effect is exhibited. For example, the protrusion portion 7b is provided at the leg 7a of the shield cover 7, the protrusion portion 7b is inserted into the attachment hole 9 of the circuit substrate 1, and thereby the position determination is performed, but if the position determination can be performed by another method, the protrusion portion 7b and the attachment hole 9 may not be provided.

It should be understood by those skilled in the art that various modifications, combinations, sub-combinations and alterations may occur depending on design requirements and other factors insofar as they are within the scope of the appended claims of the equivalents thereof.

What is claimed is:

1. An electronic circuit unit comprising:
    a rectangular-shaped circuit substrate obtained by cutting an integral substrate along a vertical cut line and a horizontal cut line, a corner portion of the circuit substrate being formed on a top surface thereof between two substrate outer edges orthogonal to each other, the substrate outer edges being formed by the cutting;
    a copper foil land for a component to be soldered thereto, the copper foil land being formed on the surface and disposed in the corner portion of the circuit substrate;
    a solder resist provided on the top surface in the corner portion around the copper foil land; and a plurality of substrate exposure portions provided on the top surface in the corner portion along each of the substrate outer edges in an area over which a flux for soldering spreads, the substrate exposure portions lacking the solder resist and exposing the top surface of the circuit substrate, wherein the solder resist is formed between the substrate exposure portions such that portions having the solder resist and the substrate exposure portions are alternately formed along the substrate outer edges.

2. The electronic circuit unit according to claim 1, wherein the plurality of substrate exposure portions have a rectangular shape and are arranged in a predetermined interval.

3. The electronic circuit unit according to claim 1, wherein the plurality of substrate exposure portions are provided from a vicinity of a tip of the corner portion to a vicinity of an end of the copper foil land.

* * * * *